United States Patent [19]
Corleto et al.

[11] Patent Number: 5,259,001
[45] Date of Patent: Nov. 2, 1993

[54] ADPCM DECODER WITH AN INTEGRAL DIGITAL RECEIVE GAIN AND METHOD THEREFOR

[75] Inventors: Jose G. Corleto; Luis A. Bonet; David Yatim, all of Austin, Tex.

[73] Assignee: Motorola, Inc., Schaumburg, Ill.

[21] Appl. No.: 810,775

[22] Filed: Dec. 17, 1991

[51] Int. Cl.$^5$ ............................................. H04B 14/06
[52] U.S. Cl. ......................................... 375/27; 375/121; 375/122; 375/30; 341/143
[58] Field of Search ............... 375/27, 30, 25, 121, 375/122; 381/31, 29; 341/143, 51; 358/133

[56] References Cited
U.S. PATENT DOCUMENTS
4,939,749  7/1990  Furcher .................................. 375/30

OTHER PUBLICATIONS
"40, 32, 24, 16 kbit/s Adaptive Differential Pulse Code Modulation (ADPCM)", CCITT Recommendation G.726, Geneva, 1990.
"MPT 1375, Common Air Interface Specification", Department of Trade and Industry, London, 1989.
"MC145532 ADPCM Transcoder Product Preview", in Motorola Telecommunications Device Data, DL 136, Rev. 2, Motorola, Inc. 1989.
"MC145554/MC145557.MC145564/MC145567 PCM Codec-Filter", in Motorola Telecommunications Device Data, DL 136, Rev. 2, Motorola, Inc., 1989.

Primary Examiner—Stephen Chin
Assistant Examiner—Tesfaldet Bocure
Attorney, Agent, or Firm—Paul J. Polansky

[57] ABSTRACT

An integral digital receive gain (44) for a G.721 or G.726 ADPCM decoder (28a) or the like in an application such as a CT-2 handset (20) allows digital volume control without the need for external components. The digital receive gain (44) receives a reconstructed signal $s_r(k)$ and a variable gain factor. The integral digital receive gain (44) multiplies the reconstructed signal by the gain factor and provides the result as an input to an output PCM format conversion (45). The digital receive gain (44) also disables a synchronous coding adjustment (46) if a gain setting other than unity gain is detected.

14 Claims, 4 Drawing Sheets

FIG. 2 —PRIOR ART—

ADPCM DECODER WITH AN INTEGRAL DIGITAL RECEIVE GAIN AND METHOD THEREFOR

FIELD OF THE INVENTION

This invention relates generally to signal processing decoders, and more particularly, to adaptive differential pulse code modulation (ADPCM) decoders with a digital receive gain.

BACKGROUND OF THE INVENTION

Many telecommunications products are required to conform to a publicly known standard or protocol. For example, CCITT Recommendation G.726-1990 specifies how a digital telephone signal is to be compressed before transmission, and how a received digital signal is to be expanded after reception, using a well-known technique known as adaptive differential pulse code modulation (ADPCM). The G.726 standard specifies the functionality that is required for the receive (ADPCM decoder) and transmit (ADPCM encoder) signal processing functions. G.726 allows for the conversion of a 64 kilobit-per-second (kbps) pulse code modulation (PCM) channel to and from a 40, 32, 24, or 16 kbps ADPCM channel. G.726 incorporates the previously-existing G.721 (32 kbps) and G.723 (24 kbps) standards.

The telephone signal sampling rate is relatively slow compared to digital logic speeds now available. The relative slowness allows a data processor to implement the G.721 protocol through microcode. In a typical implementation, for example the Motorola MC145532 ADPCM Transcoder, a special type of data processor known as a digital signal processor (DSP) is used. A DSP is a data processor with an instruction set designed to optimize performance in real-time digital signal processing applications, and DSP architectures are known in the art. By being optimized for signal processing, however, the DSP eliminates many of the instructions available from a complex instruction set (CISC) data processor.

Some telecommunications standards incorporate other standards. The U.K. Cordless Telephone, Second Generation (CT-2) specifies the use of G.721 ADPCM encoding and decoding functions. A CT-2 handset receives an analog voice signal from a microphone. The voice signal is converted to PCM, processed through a G.721 ADPCM encoder, and then modulated and transmitted (along with other signalling information) according to the CT-2 Common Air Interface (CAI) protocol to a base station. Transmit and receive signals are sent and received to and from the base station in packets in a pingpong fashion. For signal reception, a packet is received, demodulated, processed through a G.721 ADPCM decoder, converted from digital PCM to analog, and then provided to a speaker.

It is also desirable to have a volume control which can adjust the signal provided to the speaker within a wide range and with a fine resolution. Conventional volume controls, such as potentiometers, directly attenuate the receive analog data stream. These volume controls are costly in terms of space and can be inaccurate, however. In order to reduce handset cost and improve performance, new ways to adjust the volume are required.

SUMMARY OF THE INVENTION

Accordingly, there is provided, in one form, an ADPCM decoder with an integral digital receive gain comprising means for providing a reconstructed signal $s_r(k)$ in response to an input signal $I(k)$ of the ADPCM decoder, and means coupled to the means for providing signal $s_r(k)$ and to the integral digital receive gain, for providing an output signal of the ADPCM decoder $s_d(k)$ in response to a reconstructed signal with gain $s_g(k)$. The integral digital receive gain is coupled to the means for providing signal $s_r(k)$, receives signal $s_r(k)$ and a gain factor, and multiplies signal $s_r(k)$ by the gain factor to provide signal $s_g(k)$. The means for providing signal $s_r(k)$ and the means for providing signal $s_d(k)$ substantially comply with CCITT Recommendation G.726 for at least one data rate thereof.

In another form, there is provided in an ADPCM decoder substantially complying with CCITT Recommendation G.726-1990 for at least one data rate thereof, a method for adjusting a digital receive gain of the ADPCM decoder comprising the steps of providing a reconstructed signal $s_r(k)$ as feedback to an adaptive predictor; applying a gain factor to the reconstructed signal $s_r(k)$ to provide a reconstructed signal with gain $s_g(k)$; providing signal $s_g(k)$ to an output format PCM conversion; and disabling a synchronous coding adjustment in response to the gain factor being different from unity gain.

These and other features and advantages will be more clearly understood from the following detailed description taken in conjunction with the accompanying drawings.

DETAILED DESCRIPTION OF THE INVENTION

Figure 1:
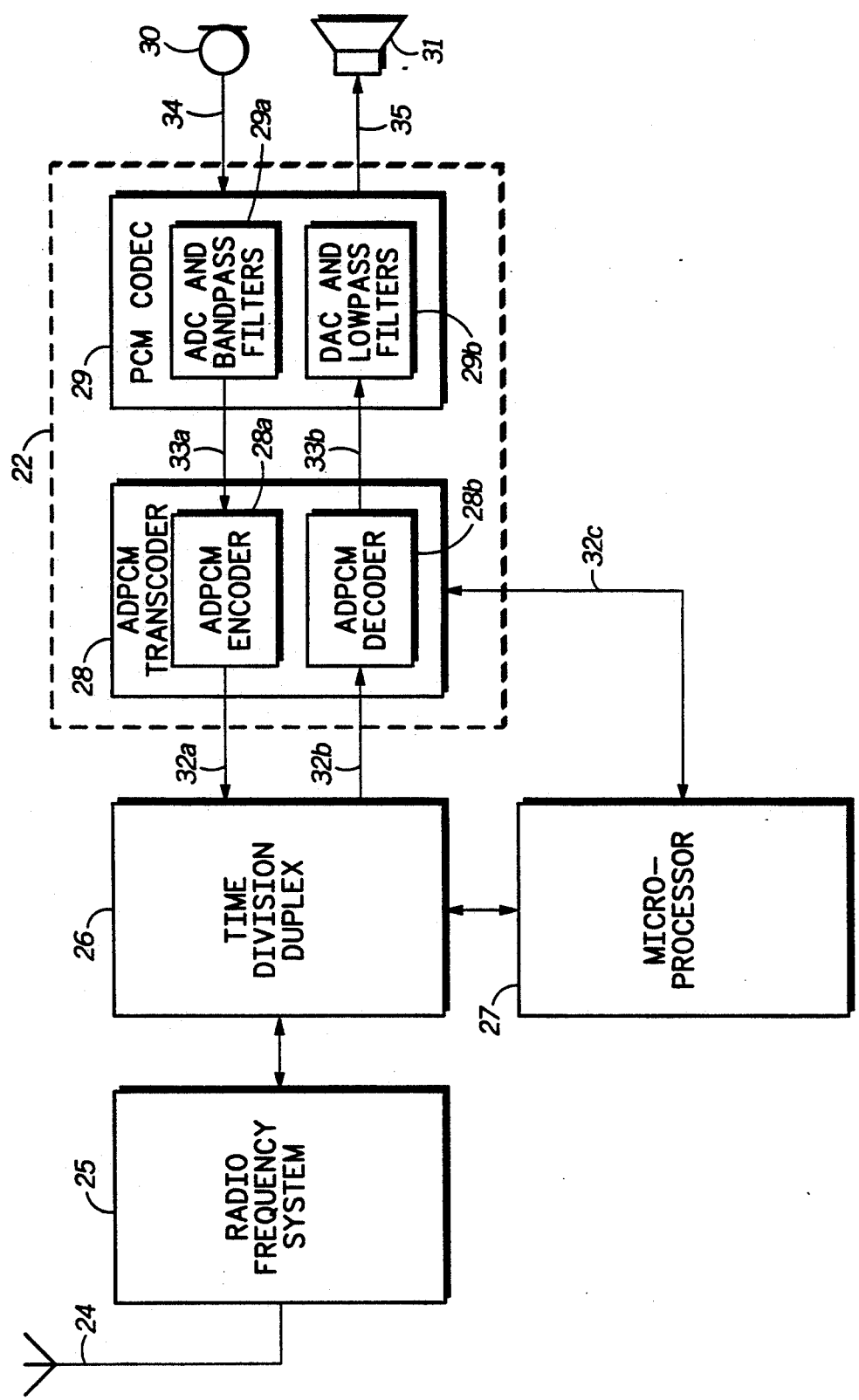
FIG. 1 illustrates in block diagram form a CT-2 telephone handset including an ADPCM CODEC.

FIG. 1 illustrates in block diagram form a CT-2 telephone handset 20 including an ADPCM CODEC 22. Handset 20 conforms to the CT-2 standard. According to the CT-2 protocol, telephone signals are received and transmitted digitally in packets in a half-duplex or ping-pong scheme between handset 20 and a base station (not shown in FIG. 1). An antenna 24 is used for transmitting and receiving radio-frequency (RF) representations of telephonic signals. An RF system 25 is connected to antenna 24 for receiving and demodulating, and transmitting and modulating, digital streams of telephonic data. As used here, the term "signal" refers to a time-varying electrical signal, and the term "digital signal" refers to a series of digital samples of the signal. A "packet" includes a portion of the digital signal, or alternatively, a specified number of digital samples of the telephone signal, along with digital signalling bits.

A microphone 30 provides an analog telephone signal via input signal lines 34 to ADPCM CODEC 22. In the illustrated embodiment, ADPCM CODEC 22 is a single integrated circuit incorporating both an ADPCM transcoder 28 and a PCM codec 29. PCM codec 29 performs the function of a conventional integrated circuit, such as the Motorola MC145554 μ-law PCM Codec-Filter or the Motorola MC145557 A-law PCM Codec-Filter. Functionally, PCM codec 29 includes two portions, an analog-to-digital converter (ADC) and bandpass filters 29a, and a digital-to-analog converter (DAC) and lowpass filters 29b. ADC and bandpass filters 29a converts the analog telephone signal to a digital telephone signal and converts it to PCM according to the A-law or μ-law algorithm, and provides the digital telephone signal to ADPCM transcoder 28 via input signals 33a. Functionally, ADPCM transcoder 28 includes two portions, an ADPCM encoder 28a, and an ADPCM decoder 28b. ADPCM encoder 28a in turn compresses the 64 kbps digital telephone signal to a 32 kbps signal according to the G.721 standard and provides the ADPCM signal to time division duplex block 26 via a signal line 32a. Time division duplex block 26 then combines signalling bits from microprocessor 27 with the compressed digital data from ADPCM transcoder 28 to form a CT-2 packet. Time division duplex block 26 provides the CT-2 packet to radio frequency system 25, which modulates it and provides it as an RF signal to antenna 24, where it is radiated and eventually received by the base station. The modulation scheme is a two-level FSK shaped by an approximately Gaussian filter, as described in the CT-2 CAI Specification.

For reception, a packet from the base station is received as a modulated RF signal on antenna 24. Radio frequency system 25 receives the RF signal and demodulates it. The packet is then presented to a time division duplex block 26. Time division duplex block 26 splits the packet into its two constituent components, making signalling bits available to microprocessor 27. Time division duplex block 26 makes the compressed digital signal available to an ADPCM transcoder 28 via signals 32b. Subsequently, microprocessor 27 reads the signalling bits and performs associated signalling functions, such as call setup and disconnect.

ADPCM decoder 28b decompresses the compressed digital signal received from time division duplex block 26. In the illustrated embodiment, as part of a CT-2 handset, ADPCM decoder 28b conforms to CCITT Recommendation G.721. ADPCM decoder 28b converts the 32 kbps ADPCM digital signal to 64 kbps PCM according to standard G.721 ADPCM. ADPCM transcoder 28 is connected via input and output signals 32c to microprocessor 27, which initializes and controls the operation thereof. DAC and lowpass filters 29b receives the PCM data via input signals 33b, performs A-law or μ-law decompression and digital-to-analog conversion to form an analog telephone signal, and provides the analog telephone signal to a speaker 31 and a ringer (not shown in FIG. 1) via output signals 35.

Handset 20 has three gain adjustments. The first gain adjustment (not shown) is connected to signals 35 and sets the volume of speaker 31 to a nominal value. The first gain adjustment sets the volume of speaker 31 to a nominal value defined by the CAI specification when a 32 kbps ADPCM signal of a given level is received by handset 20. Thus the first gain adjustment is a coarse adjustment, and is typically set by a fixed-value resistor. The second gain adjustment is applied to the analog signal after DAC and lowpass filters 29b converts the digital PCM signal to analog but before lowpass filtering. This second gain adjustment, sometimes referred to as the "trim gain," is set by the handset manufacturer to compensate for operating characteristics of the components. The second gain adjustment is thus a fine adjustment. The third gain adjustment is a user-accessible volume control. Typically, the volume control is connected to output signals 35 to control the volume of speaker 31. However, connecting a volume control to speaker 31 at signals 35 requires an external component, which is costly in terms of space and is inaccurate. ADPCM decoder 28b reduces the space required for handset 20 and improves the accuracy of the signal presented to speaker 31 by including an integral digital volume control, which is further described below.

Figure 2:
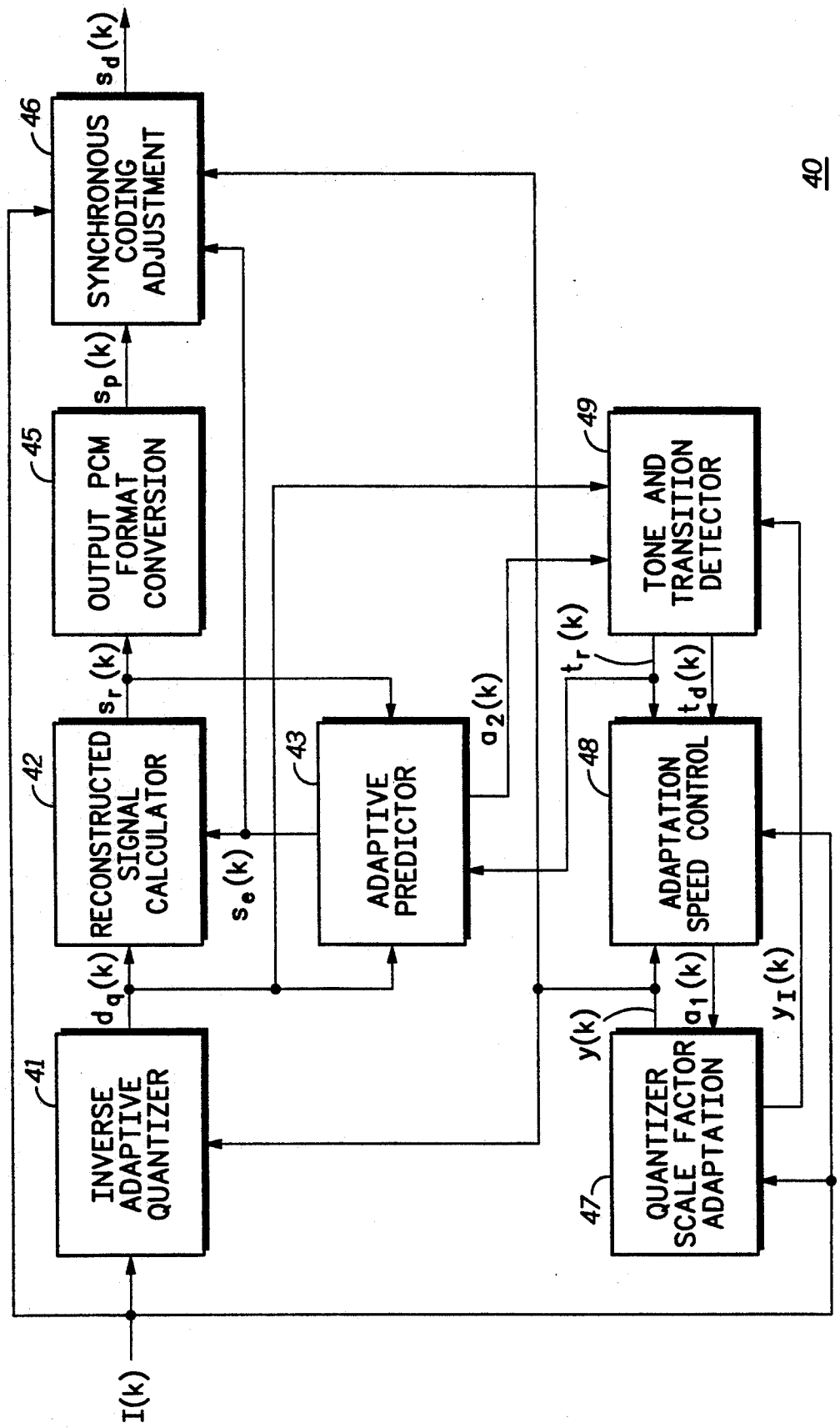
FIG. 2 illustrates in block form a functional block diagram of a prior art ADPCM decoder conforming to CCITT Recommendation G.721 or G.726.

FIG. 2 illustrates in block form a functional block diagram of a prior art ADPCM decoder 40 conforming to CCITT Recommendation G.721 or G.726. ADPCM decoder 40 includes an inverse adaptive quantizer 41, a reconstructed signal calculator 42, an adaptive predictor 43, an output PCM format conversion 45, a synchronous coding adjustment 46, a quantizer scale factor adaptation 47, an adaptation speed control 48, and a tone and transition detector 49. The operation of each of these functional blocks is well-known and is described in CCITT Recommendation G.726-1990.

FIG. 2 illustrates a problem with digital volume control. Since ADPCM decoder 40 is typically implemented with a single integrated circuit, only signal $s_d(k)$ is available to perform volume control. However, signal $s_d(k)$ is a digital representation of the telephone signal which is still in logarithmic PCM form. In order to provide a digital volume control on signal $s_d(k)$, it is necessary to convert it to a linear format, perform the gain adjustment, and reconvert it to logarithmic format to provide to PCM codec 29. Two methods of conversion are possible. First, a programmable logic array (PLA) could provide a conversion table to change each of the $2^8$ encoded signals to 13-bit linear signals. Obviously such a PLA would require a large amount of integrated circuit area. Also, the reconversion back to 8-bit PCM data would require a similar PLA with $2^{13}$ lines. Thus, such an approach is very undesirable. Second, a data processor may read the 8-bit PCM data and convert it to linear. However, this method is time-consuming, requiring a large number of processor cycles. Both approaches suffer the disadvantage that additional distortion is introduced; with each conversion from logarithmic to linear and back again, rounding errors inevitably occur.

Figure 3:
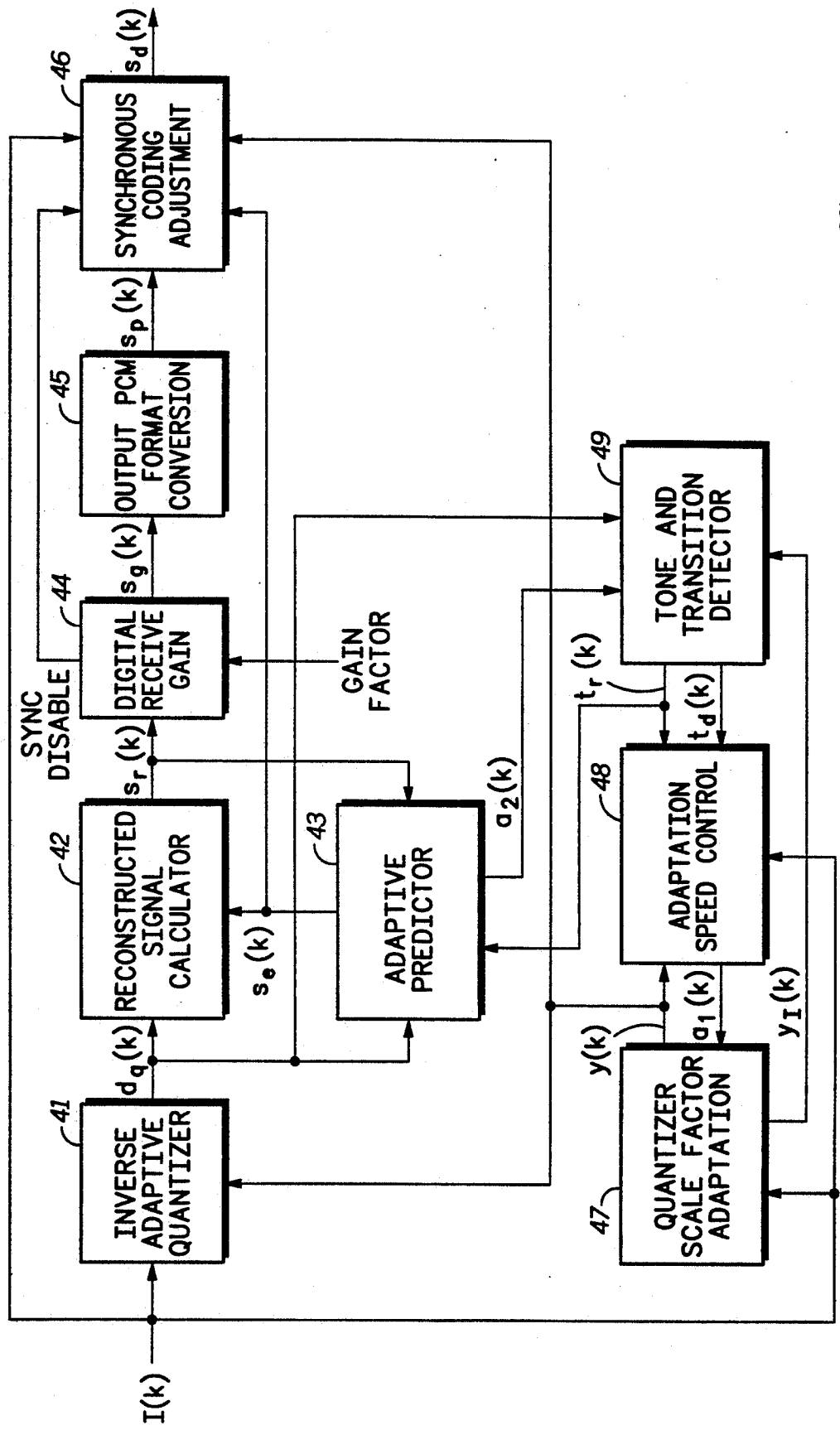
FIG. 3 illustrates in block form a functional block diagram of the ADPCM decoder of FIG. 1 in accordance with the present invention.

FIG. 3 illustrates in block form a functional block diagram of ADPCM decoder 28b of FIG. 1 in accordance with the present invention. ADPCM decoder 28b includes a digital receive gain 44. Digital receive gain 44 receives the reconstructed signal $s_r(k)$ and a variable GAIN FACTOR. In response, digital receive gain 44 provides a reconstructed signal with gain labelled "$s_g(k)$", and a signal labelled "SYNC DISABLE" to synchronous coding adjustment 46. All other blocks perform identically to the ADPCM decoder specified in G.721 or G.726 and shown in FIG. 2.

Microprocessor 27 provides GAIN FACTOR via a conventional serial communications port (SCP) of ADPCM transcoder 28 (not shown in FIG. 1). In an application in which ADPCM decoder 28b retransmits data, it is necessary to set GAIN FACTOR to 1. In such a case, synchronous coding adjustment 46 prevents cumulative distortion from occurring on synchronous tandem codings, as described in CCITT Recommendation G.726-1990. When GAIN FACTOR=1 (unity gain), ADPCM decoder 28b inactivates SYNC DISABLE, but otherwise operates identically to ADPCM decoder 40. Signal $s_r(k)$ is presented unaltered to output PCM format conversion 45. However, in an application in which ADPCM decoder 28b does not retransmit data, such as a telephone handset, GAIN FACTOR may be set to something besides unity gain. When GAIN FACTOR is not set to unity gain, ADPCM decoder 28b activates SYNC DISABLE to disable synchronous coding adjustment 46. ADPCM decoder 28b multiplies input signal $s_r(k)$ by GAIN FACTOR and provides the result as signal $s_g(k)$. At the same time, synchronous coding adjustment 46 is disabled and passes input signal $s_p(k)$ to the output, as signal $s_d(k)$, without alteration.

In the preferred embodiment, GAIN FACTOR is a seven-bit, fixed point number with two integer and five decimal digits. The decimal representation of the gain is equal to 20 log(GAIN FACTOR). With a seven-bit GAIN FACTOR, digital receive gain 44 provides a gain adjustment between approximately −30 dB and +12 dB, with linear steps of 0.03125. Thus, ADPCM decoder 28b provides a wide range of gains with a fine resolution. Digital receive gain 44 is also outside a feedback loop from reconstructed signal calculator 42 to adaptive predictor 43. If digital receive gain 44 were provided to signal $s_r(k)$ before signal $s_r(k)$ is provided to adaptive predictor 43, then instability would result because the gain would interfere with the feedback loop. Each block of ADPCM decoder 28b is implemented by microcode running on a DSP (not shown in FIG. 3). During each sample time (125 μsec), the DSP must implement the ADPCM decoder function. In addition, the DSP must perform other tasks, such as the function of ADPCM encoder 28a. However, the function of digital receive gain 44 is easily implemented in microcode by using a multiply instruction, requiring a relatively-small number of microcode cycles.

Digital receive gain 44 provides gain adjustment without the need for extra components, either in the form of analog volume control components such as a potentiometer, or digital hardware such as a PCM-to-linear PLA. Furthermore, digital receive gain 44 performs the gain adjustment without the need to convert the PCM signal to linear, perform the gain adjustment, and reconvert the linear data back to PCM, causing extra rounding errors. It should be noted that other reasons may justify the use of an external component to affect the analog output signal at output terminal 35. For example, handset 20 of FIG. 1 includes an external component to set the receive level to a nominal value as specified in the CAI specification.

Figure 4:
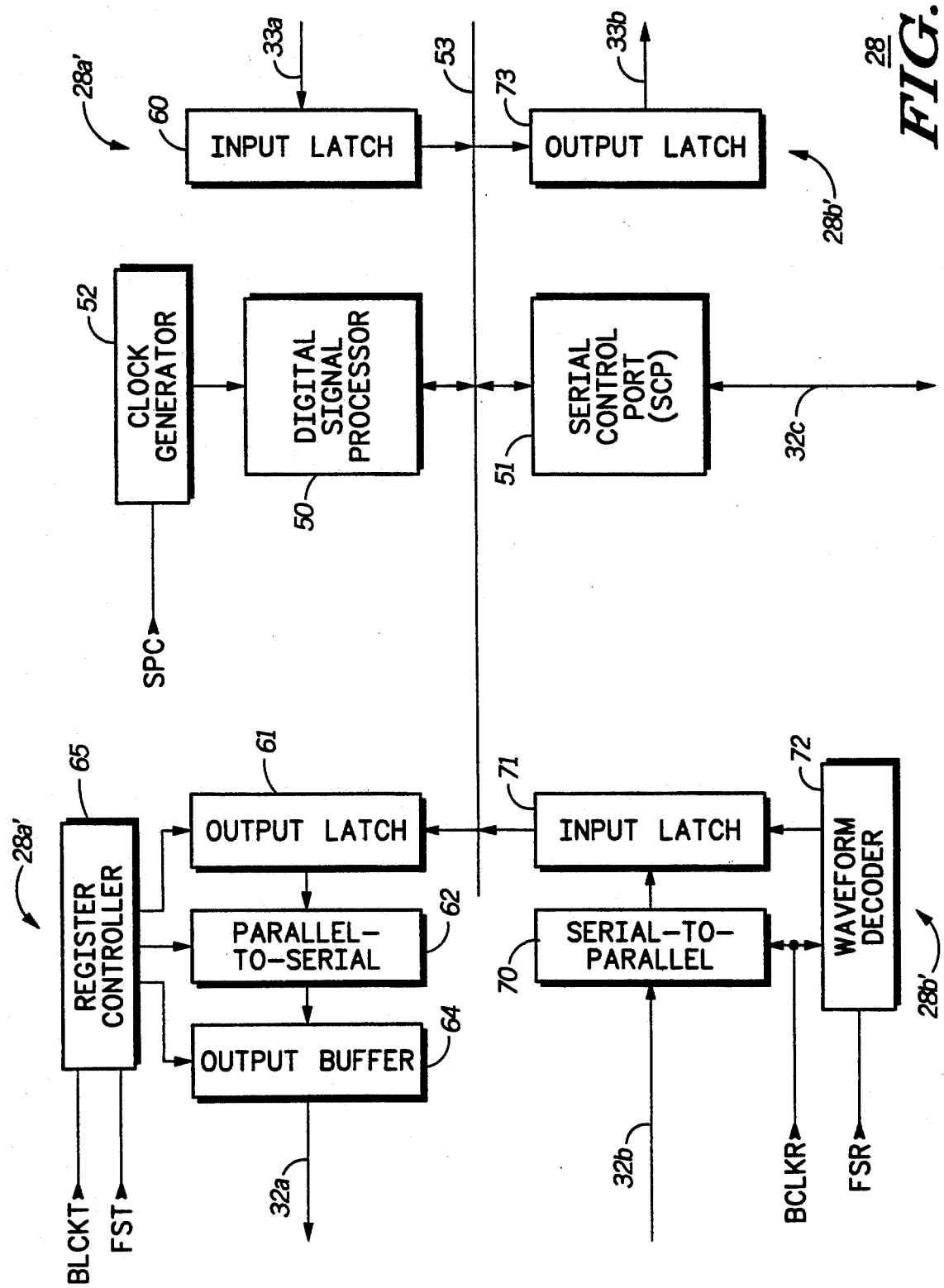
FIG. 4 illustrates in block form the ADPCM transcoder of FIG. 1 in accordance with a preferred embodiment of the present invention.

FIG. 4 illustrates in block form ADPCM transcoder 28 of FIG. 1 in accordance with a preferred embodiment of the present invention. It should be noted that FIG. 4 depicts ADPCM transcoder 28 according to functional blocks representative of hardware circuitry. By contrast, FIG. 3 illustrates a functional block diagram of ADPCM decoder 28b. FIG. 4 clarifies how the blocks of ADPCM transcoder 28 perform the functions illustrated by FIG. 3. In FIG. 4, blocks which correspond to the encoder function are referred to as 28a', and blocks which correspond to the decoder function are labelled 28b', with the remaining blocks performing parts of both functions.

ADPCM transcoder 28 includes a digital signal processor (DSP) 50. DSP 50 is coupled to a communications bus 53 for receiving data therefrom and providing data thereto. A clock generator 52 receives a signal labelled "SPC" which is the output of a crystal oscillator external to ADPCM CODEC 22 (not shown). Clock generator 52 is coupled to DSP 50 and provides a clock signal thereto. A serial control port (SCP) 51 is also connected to communications bus 53. SCP 51 is connected to microprocessor 27 of FIG. 1 via signal lines 32c. SCP 51 allows microprocessor 27 to initialize and control the operation of ADPCM transcoder 28, and to provide GAIN FACTOR to ADPCM transcoder 28.

ADPCM encoder 28a' includes an input latch 60, an output latch 61, a parallel-to-serial block 62, an output buffer 64, and a register controller 65. Input latch 60 is connected to PCM codec 29 via input signal lines 33a. Input latch 60 latches an 8-bit PCM word from PCM codec 29 and provides the data to DSP 50 via communications bus 53. DSP 50 performs the function of a G.721 ADPCM encoder through microcode. DSP 50 also provides ADPCM data words via communications bus 53 to output latch 61. The ADPCM data word may be either 8, 4, 3, or 2 bits corresponding to a data rate of either 64, 32, 24, or 16 kbps, respectively. In the CT-2 handset, however, a data word of 4 bits corresponding to the G.721 32 kbps data rate is used. Parallel-to-serial block 62 is connected to output latch 61 and provides an ADPCM data word serially to output buffer 64, which provides the data to time division duplex block 26 via signal line 32a. Register controller 65 is connected to, and controls the operation of, output latch 61, parallel-to-serial block 62, and output buffer 64 in response to a clock input signal labelled "BLCKT" and a control signal labelled "FST".

ADPCM decoder 28b' includes a serial-to-parallel block 70, in input latch 71, a waveform decoder 72, and an output latch 73. Serial-to-parallel block 70 receives an ADPCM-encoded stream of data bits via input signal line 32b, combines the data into ADPCM data words, and provides the data words to input latch 71. Input latch 71 stores an ADPCM data word and makes it available to DSP 50. Waveform decoder 72 receives input signals labelled "FSR" and "BCLKR". Signal BCLKR clocks the received data, and signal FSR determines the operating mode. Together, signals BCLKR and FSR determine operation at a data rate of either 64, 32, 24, or 16 kbps. In the CT-2 handset, however, a data word of 4 bits corresponding to the G.721 32 kbps data rate is used. DSP 50 performs the function of a G.721 ADPCM decoder having the digital volume control function illustrated in FIG. 3 in microcode. DSP 50 provides digital PCM signal $s_d(k)$ to output latch 73, which subsequently provides it to PCM codec 29 via signal line 33b.

ADPCM transcoder 28 performs the functions of a G.721 ADPCM encoder and a G.721 ADPCM decoder. In FIG. 4, several blocks of integrated circuit hardware assist DSP 50 in performing each function. Microcode running on DSP 50 actually performs the functional block diagram of FIG. 3, and thus DSP 50 is common to both the ADPCM encoder and decoder functions. In an alternate embodiment, some or all of the functional blocks of FIG. 3 may be performed by hardware circuitry. However, because of the efficiency with which DSP 50 implements digital receive gain 44, by using spare clock cycles that are not needed to perform the other encoder and decoder functions, microcode implementation is preferred. DSP 50 implements digital receive gain 44 by multiplying the intermediate signal $s_r(k)$ by GAIN FACTOR to provide signal $s_g(k)$.

While the invention has been described in the context of a preferred embodiment, it will be apparent to those skilled in the art that the present invention may be modified in numerous ways and may assume many embodiments other than that specifically set out and described above. For example, an ADPCM decoder in accordance with the present invention may operate with any of the G.726-specified data rates. In addition, ADPCM decoder 28b may be used in decoders which operate similarly to, but do not conform with, standard G.726 or G.721, while retaining the advantages of digital receive gain 44. One example of an ADPCM decoder substantially but not fully complying with G.726 is one which eliminates the synchronous coding adjustment. While functional blocks implemented with microcode were illustrated, it is also possible to perform the ADPCM decoder function with hardware circuitry. Any data processor, rather than a DSP, may also be used to perform the function of any portion of ADPCM decoder 28b. Accordingly, it is intended by the appended claims to cover all modifications of the invention which fall within the true spirit and scope of the invention.

We claim:

1. An ADPCM decoder with an integral digital receive gain, comprising:

means for providing a reconstructed signal $s_r(k)$ in response to an input signal $I(k)$ of the ADPCM decoder;

the integral digital receive gain coupled to said means for providing said signal $s_r(k)$, for receiving said signal $s_r(k)$ and a gain factor, and for multiplying said signal $s_r(k)$ by said gain factor to provide a reconstructed signal with gain $s_g(k)$; and means coupled to said means for providing said signal $s_r(k)$ and to the integral digital receive gain, for providing an output signal of the ADPCM decoder $s_d(k)$ in response to said signal $s_g(k)$;

said means for providing said signal $s_r(k)$ and said means for providing said signal $s_d(k)$ substantially complying with CCITT Recommendation G.726 for at least one data rate thereof.

2. The ADPCM decoder of claim 1 wherein said means for providing said signal $s_d(k)$ comprises an output PCM format conversion for receiving said signal $s_g(k)$ and for providing a signal $s_p(k)$ in response, an operation of said output PCM format conversion defined by CCITT G.726 for said at least one data rate.

3. The ADPCM decoder of claim 2 wherein said means for providing said signal $s_d(k)$ further comprises:

a synchronous coding adjustment coupled to said integral digital receive gain and to said output PCM format conversion, for receiving a disable signal and said signal $s_p(k)$, for providing an output signal $s_d(k)$ equal to said signal $s_p(k)$ in response to said disable signal, and for providing said signal $s_d(k)$ according to CCITT Recommendation G.726 in response to said disable signal being inactive;

the integral digital receive gain comprising means for providing said disable signal in response to said gain factor being different from unity gain.

4. The ADPCM decoder of claim 1 wherein said means for providing said signal $s_r(k)$ comprises:

an inverse adaptive quantizer for receiving said signal $I(k)$ and providing an output signal $d_q(k)$ in response;

a reconstructed signal calculator coupled to said inverse adaptive quantizer, for receiving said signal $d_q(k)$ and for providing said signal $s_r(k)$ in response; and an adaptive predictor coupled to said inverse adaptive quantizer and to said reconstructed signal calculator, for receiving said signals $d_q(k)$ and $s_r(k)$, and providing a signal $s_e(k)$ to said reconstructed signal calculator and to said means for providing said signal $s_d(k)$ in response.

5. An ADPCM decoder with an integral digital receive gain comprising:

an inverse adaptive quantizer for receiving an input signal $I(k)$ and providing an output signal $d_q(k)$ in response;

a reconstructed signal calculator coupled to said inverse adaptive quantizer, for receiving said signal $d_q(k)$ and for providing an output signal $s_r(k)$ in response;

an adaptive predictor coupled to said inverse adaptive quantizer and to said reconstructed signal calculator, for receiving said signals $d_q(k)$ and $s_r(k)$, and providing a signal $s_e(k)$ to said reconstructed signal calculator in response;

the integral digital receive gain coupled to said reconstructed signal calculator, for receiving said signal $s_r(k)$ and a gain factor, for providing a reconstructed signal with gain $s_g(k)$ in response to a product of said signal $s_r(k)$ and said gain factor, and for providing a disable signal in response to said gain factor being different from unity gain;

an output PCM format conversion coupled to said digital receive gain, for receiving said signal $s_g(k)$ and for providing a signal $s_p(k)$ in response;

said inverse adaptive quantizer, reconstructed signal calculator, adaptive predictor, and output PCM format conversion each having input/output characteristics defined by CCITT Recommendation G.726; and a synchronous coding adjustment coupled to said output PCM format conversion and to said digital receive gain, for receiving said disable signal and said signals $I(k)$, $s_e(k)$, and $s_p(k)$, for providing an output signal $s_d(k)$ equal to said signal $s_p(k)$ in response to said disable signal, and for providing said signal $s_d(k)$ according to CCITT Recommendation G.726 in response to said disable signal being inactive.

6. The ADPCM decoder of claim 5 wherein a digital signal processor performs the integral digital receive gain through microcode.

7. In an ADPCM decoder substantially complying with CCITT Recommendation G.726-1990 for at least one data rate thereof, a method for adjusting a digital receive gain of the ADPCM decoder comprising the steps of:

providing a reconstructed signal $s_r(k)$ as feedback to an adaptive predictor;

applying a gain factor to said reconstructed signal $s_r(k)$ to provide a reconstructed signal with gain $s_g(k)$;

providing said reconstructed signal with gain $s_g(k)$ to an output format PCM conversion; and disabling a synchronous coding adjustment in response to said gain factor being different from unity gain.

8. The method of claim 7 wherein the step of applying further comprises applying said gain factor of a plurality of receive gain factors having incremental differences therebetween of approximately 0.03125.

9. The method of claim 8 wherein the step of applying further comprises applying said gain factor of said plurality of receive gain factors providing gains from approximately −30 dB to approximately +12 dB.

10. The method of claim 7 wherein said step of applying further comprises the step of providing a digital signal processor to multiply said gain factor by said reconstructed signal $s_r(k)$ to provide said reconstructed signal with gain $s_g(k)$.

11. A method for adjusting a digital receive gain of an ADPCM decoder comprising the steps of:

receiving an input signal $I(k)$ at an input of an inverse adaptive quantizer and providing an output signal $d_q(k)$ in response;

receiving said signal $d_q(k)$ at an input of a reconstructed signal calculator and providing a signal $s_r(k)$ in response;

receiving said signals $d_q(k)$ and $s_r(k)$ at inputs of an adaptive predictor, and providing a signal $s_e(k)$ to said reconstructed signal calculator in response;

providing a signal $s_p(k)$ at an output of an output PCM format conversion;

receiving said signals $I(k)$, $s_e(k)$, and $s_p(k)$ at inputs of a synchronous coding adjustment, and providing an output signal $s_d(k)$ in response, said output signal $s_d(k)$ being an output signal of the ADPCM decoder;

applying a gain factor to said reconstructed signal $s_r(k)$ to provide a reconstructed signal with gain $s_g(k)$;

providing said reconstructed signal with gain $s_g(k)$ to said output PCM format conversion; and disabling said synchronous coding adjustment in response to said gain factor being different from unity gain.

12. The method of claim 11 wherein the step of applying further comprises applying said gain factor of a plurality of receive gain factors having incremental differences therebetween of 0.03125.

13. The method of claim 12 wherein the step of applying further comprises applying said gain factor of said plurality of receive gain factors providing gains from apprroximately −30 dB to +12 dB.

14. The method of claim 13 wherein said step of applying further comprises the step of providing a digital signal processor to multiply said gain factor by said reconstructed signal $s_r(k)$ to provide said reconstructed signal with gain $s_g(k)$.

* * * * *